Aug. 25, 1970 J. E. BARBAY, JR 3,525,879

VARIABLE RANGE LIMITER CIRCUIT

Filed June 13, 1966

INVENTOR
JOSEPH E. BARBAY JR.
BY R. C. Terry
ATTORNEY

United States Patent Office 3,525,879
Patented Aug. 25, 1970

3,525,879
VARIABLE RANGE LIMITER CIRCUIT

Joseph E. Barbay, Jr., Skokie, Ill., assignor to Teletype Corporation, Skokie, Ill., a corporation of Delaware Filed June 13, 1966, Ser. No. 556,978
Int. Cl. H03k 5/08
U.S. Cl. 307—237 3 Claims

ABSTRACT OF THE DISCLOSURE

A limiter circuit applies only a predetermined portion of an AC input signal to a load; and this portion may be shifted to any desired part of the input signal excursions by connecting a Zener diode in series between a pair of variable resistors, with the diode also being connected in parallel with the series-connected load and transistor output amplifier. The Zener diode determines the portion of the signal applied to the load, and the relative values of the resistors determine from which part of the input signal excursions this portion is obtained.

The usual purpose of a limiter circuit is to remove amplitude modulation and to deliver a frequency-modulation (or continuous-wave) signal having a constant amplitude. In prior limiter circuits, the area of the amplitude of the waveform that passed through the limiter was centered about the point of zero amplitude of the input signal.

It is an object of the present invention to limit an input signal and to deliver a portion of the input signal that is centered about any predetermined value of the input signal.

It is another object of the present invention to limit all parts of an input signal that exceed one predetermined voltage and that fall below another predetermined voltage.

According to the preferred embodiment of the invention, a signal is supplied to the base of an emitter-follower transistor amplifier as variations about a fixed voltage level. The transistor amplifier has two variable resistors connected in series with the load and with the transistor. A Zener diode voltage limiting device is connected in parallel with the load and the transistor to prevent voltages in excess of the avalanche voltage of the Zener diode from being applied across the load. The two variable resistors comprise a voltage divider and are adjusted so as to determine the portion of the total input signal that is applied across the load. All other portions of the input signal are either shunted by the Zener diode or blocked by the transistor. Varying the ratio of resistances of the two voltage-divider resistors changes the turn-on voltage level of the transistor with respect to the input thereby changing the portion of the input signal waveform which is applied across the load within the range determined by the avalanche voltage of the Zener diode.

A more complete understanding of the invention may be had by referring to the following detailed description when considered in conjunction with the accompanying drawing wherein.

Figure 1:
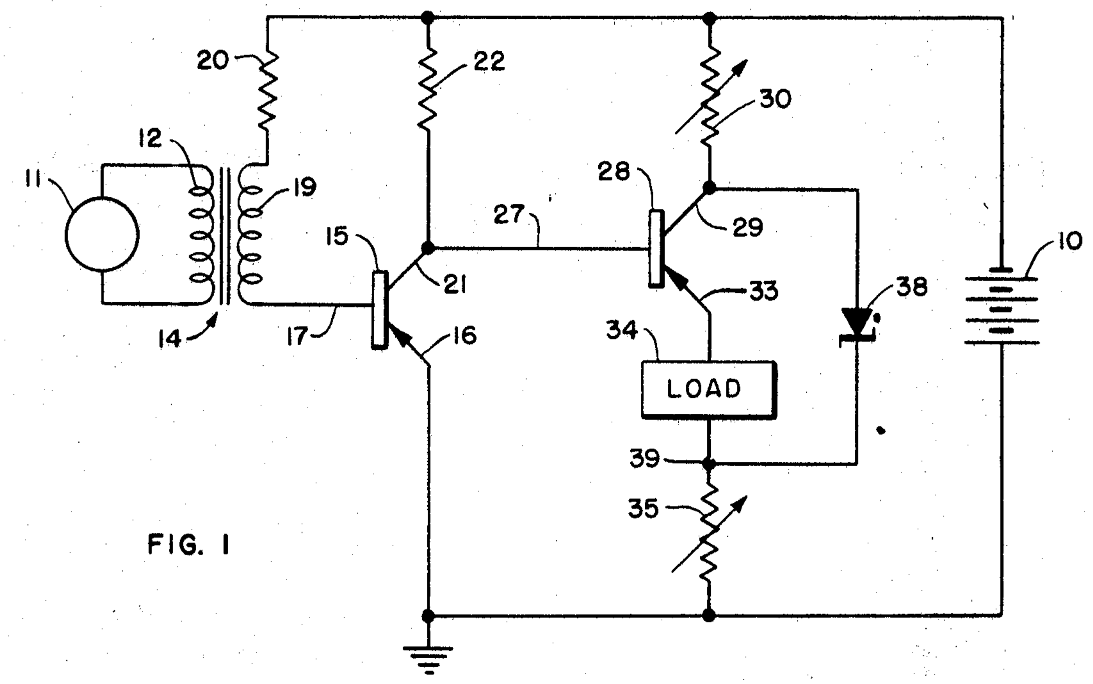
FIG. 1 is a schematic diagram of the preferred embodiment of the invention.

Referring now to the drawing and more particularly to FIG. 1, a circuit for attaining the objects of the present invention is supplied with operating voltage and current by a voltage source 10. A signal source 11 generates signals of one or more frequencies and of varying amplitudes and supplies these signals to a primary winding 12 of a coupling transformer 14. A transistor amplifier 15 is connected in a common-emitter configuration with its emitter electrode 16 connected to the positive (grounded) terminal of the voltage source 10. The base electrode 17 of transistor 15 is connected to one terminal of the secondary winding 19 of the coupling transformer 14. The other terminal of the secondary winding 19 is connected through a base-bias resistor 20 to the negative terminal of the voltage source 10 thereby biasing transistor 15 into a conductive state independent of signals supplied by signal source 11. The collector electrode 21 of transistor 15 is connected through a collector resistor 22 to the negative terminal of the voltage source 10 providing a current path from the positive terminal of the voltage source 10, through the emitter 16 and collector 21 of the transistor 15 and collector resistor 22, to the negative terminal of voltage source 10. Since base-bias resistor 20 conducts current from base 17 of transistor 15, transistor 15 conducts a quiescent current from its emitter 16 to its collector 21. The resistance of resistor 20 and the resistance of resistor 22 are proportioned so that collector 21 of transistor 15 is maintained at a quiescent voltage approximately midway between the voltages present on the positive and negative terminals of the voltage source 10.

Signals generated in signal source 11 are impressed upon the primary winding 12 of the transformer 14 and generate current fluctuations in secondary winding 19 of the transformer 14. These fluctuations of the current flowing through the secondary winding 19 of transformer 14 cause fluctuations in the current flowing from emitter 16 to collector 21 of transistor 15. As a result of this well-known amplifying characteristic of the transistor, a representation exists at collector 21 of the signals obtained from the signal source 11. Signals are normally provided by signal source 11 at sufficient amplitudes to cause the total voltage swing of collector 21 to tend to exceed the voltage of voltage source 10. This results in periodic saturation and cutoff of transistor 15 and a conventional limiting of the signals obtained from signal source 11.

Collector 21 of transistor 15 is connected directly to the base electrode 27 of another transistor 28. Collector electrode 29 of transistor 28 is connected through a variable resistor 30 to the negative terminal of voltage source 10. The emitter electrode 33 of transistor 28 is connected in the manner of an emitter-follower amplifier to a load 34 which is connected through another variable resistor 35 to the positive terminal of voltage source 10. Therefore, the voltage waveform available at collector 21 of transistor 15 is applied to the load 34 through the emitter-base junction of transistor 28. A Zener diode 38 is connected between the collector 29 of transistor 28 and the positive terminal 39 of the load 34 in order to limit the amount of voltage applied across the load 34 to a maximum value equal to the avalanche voltage of the Zener diode 38. When transistor 28 is conducting current heavily, the voltage drop across the load is never allowed to exceed the avalanche voltage of the Zener diode 38. When Zener diode 38 is conducting current, a voltage divider exists comprising variable resistor 30, Zener diode 38, and variable resistor 35. The ratio of the values of the resistance of variable resistors 30 and 35 determined whether the voltage applied to load 34 is approximately at the voltage of the negative terminal of the voltage source 10 or approximately at the voltage of the positive terminal of the voltage source 10. Since transistor 28 is connected as an emitter-follower, the voltage applied to the load 34 at the emitter 33 of transistor 28 always tends to be substantially the same voltage as that available at collector 21 of transistor 15. Therefore, as variable resistor 35 is adjusted to a low value of resistance and resistor 30 is adjusted to a high value of resistance, signal voltages are supplied across the load 34 within a range determined by the Zener diode when the voltage of collector 21 of transistor 15 traverses this range nearer the voltage of the positive terminal of voltage source 10 than the voltage of the negative terminal of voltage source 10. Conversely, if variable resistor 35 is adjusted to a high value of resistance and variable resistor 30 is adjusted to a low value of resistance, significant signals are supplied to load 34 only when the voltage of collector 21 traverses this range nearer the voltage of the negative terminal than the voltage of the positive terminal of voltage source 10.

Figure 2:
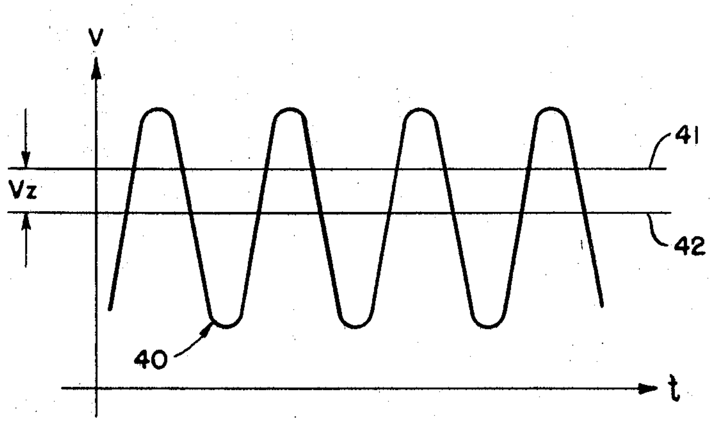
FIG. 2 is a typical waveform showing a typical sampling voltage range of that waveform.

This phenomenon is shown graphically in FIG. 2 wherein the signal waveform 40 of collector 21 of transistor 15 is shown with two reference lines 41 and 42 drawn through it. The difference between lines 41 and 42 along the ordinate of the graph is equal to the value, $V_z$, the avalanche voltage of the Zener diode 38, and lines 41 and 42 define the sampling segment of the signal. If the positive terminal of voltage source 10 is used as the zero ordinate on the graph of FIG. 2, the load 34 will experience a signal waveform that is substantially the same as the signal waveform between lines 41 and 42 when resistor 35 is adjusted to a substantially higher value of resistance than resistor 30. In order to apply a waveform sampling level to the load that is lower in voltage than the sampling level between lines 41 and 42 of FIG. 2, the resistance of resistor 35 is reduced and the resistance of resistor 30 is increased. This causes signals to be applied to the load 34 at a lower value of voltage at collector 21.

As an example of the operation of the circuit, a value of 24 volts is chosen for voltage source 10 with the positive terminal of voltage source 10 grounded to provide a voltage reference. Resistors 20 and 22 are proportioned to maintain collector electrode 21 of transistor 15 at a quiescent voltage of approximately —12 volts with respect to ground. Assuming a maximum desired current of ten milliamperes through load 34 and a maximum desirable voltage of 6 volts across load 34, Zener diode 38 is chosen to have an avalanche voltage of 6 volts and variable resistors 30 and 35 are adjusted so that the sum of their resistances equals 1800 ohms. In order to provide load 34 with a sampling range that is centered about the point of zero amplitude from the signal input of signal source 11, the variable resistors 30 and 35 are adjusted to 900 ohms each. As signals are applied to the base 17 of transistor 15, the voltage of its collector varies from ground to —24 volts. At an instant when the voltage of collector 21 of transistor 15 is at ground potential, the voltage of positive terminal 39 of load 34 is held at —9 volts and transistor 28 is biased into its cut off region, permitting substantially zero current to flow through load 34. Therefore, the ten milliamperes of current flowing through resistor 35 is shunted around load 34 and transistor 28 by the Zener diode 28 which applies its 6 volts avalanche voltage substantially across the emitter and collector terminals of transistor 28. When the voltage of collector 21 of transistor 15 reaches —9 volts, transistor 28 begins conducting current through load 34. As the voltage of collector 21 continues to become more negative, this voltage is substantially applied to the emitter 33 of transistor 28 and directly across the load except for the 9-volt drop across resistor 35. When the voltage of collector 21 of transistor 15 reaches —15 volts, the emitter 33 of transistor 28 is at substantially the same voltage as its collector 29. As the voltage of collector 21 becomes more negative, no additional current flows through load 34 because Zener diode 38 limits the voltage across load 34 and transistor 28 which is now saturated.

If the value of the resistance of resistor 35 is changed to 600 ohms and the value of the resistance of resistor 30 is changed to 1200 ohms, maintaining a total resistance of 1800 ohms, the maximum current flowing through load 34 is still 10 milliamperes and the maximum voltage across load 34 is still 6 volts determined by Zener diode 38; but current now begins flowing in load 34 when the collector 21 of transistor 15 reaches —6 volts instead of —9 volts and current does not increase further in load 34 after collector 21 reaches —12 volts instead of —15 volts. Therefore, it can be seen that varying the ratio of resistances of the variable resistors 30 and 35 changes the point at which current begins to flow in load 34 and correspondingly varies the voltage of collector 21 at which no further increase in current flowing in load 34 takes place.

In the operation of the circuit, it has been found to be convenient to adjust the current flowing through resistor 30 and resistor 35 to a value that is higher than the dividend of the avalanche voltage of Zener diode 38 divided by the impedance of the load. This assures that some current is flowing through Zener diode 38 when transistor 28 is saturated and that the full avalanche voltage of Zener diode 38 is then applied across load 34. It has also been found convenient to change the voltage sampling level for the load 34 by varying resistors 30 and 35, yet always keeping the sum of their resistances equal. This permits a signal to be applied to the load at variable sampling voltages of the input waveform by simply reducing or increasing the resistances of resistors 30 and 35 by equal opposite amounts.

Although only one embodiment of the invention is shown in the drawing and described in the foregoing specification, it will be understood that invention is not limited to the specific embodiment described, but is capable of modification and rearrangement and substitution of parts and elements without departing from the spirit of the invention.

What is claimed is:

1. A circuit for applying to a load a sampling segment of a signal, wherein the amplitude of the sampling segment of the signal is less than the amplitude of the signal, said circuit comprising:
   - means connected to the load for absorbing portions of the signal in excess of the sampling segment of the signal;
   - an amplifier having an input and an output with said output connection to the load; and
   - a voltage divider comprising two variable resistors connected in series with the amplifier for determining the bias level of the input to the amplifier.

2. A limiter circuit including a load;
   - a source of AC input signals;
   - means responsive to the input signals for applying output signals to the load, said output signals being directly proportional to the input signals;
   - means limiting the amplitude of the output signals applied to the load to a predetermined range, and
   - means in series with the load and the input signal responsive means for controlling the input signal responsive means to adjust the position of said range with respect to the input signals.

3. A limiter circuit including a load comprising:
   - a source of AC input signals;
   - an amplifier connected in series with the load for applying output signals to the load, the output signals being directly proportional to the input signal;

a voltage limiting device connected in parallel with the series-connected load and amplifier for limiting the amplitude of the output signals applied to the load to a predetermined range; and means for establishing the bias level to the input of the amplifier to adjust the position of the range with respect to the input signals.

References Cited

UNITED STATES PATENTS

| | | | |
|---|---|---|---|
| 2,318,644 | 5/1943 | Tubbs | 328—267 X |
| 3,098,936 | 7/1963 | Isabeau | 328—169 X |
| 3,192,408 | 6/1955 | Cho | 328—150 X |
| 3,193,696 | 7/1965 | Waldron | 328—267 X |
| 2,547,809 | 4/1951 | Burger | 328—165 |
| 2,963,698 | 12/1960 | Slocomb | 307—232 X |
| 3,064,143 | 11/1962 | Sanderson | 307—237 |
| 3,196,289 | 7/1965 | Heizer | 307—237 |
| 3,197,714 | 7/1965 | Prevallet | 331—1 |

JOHN S. HEYMAN, Primary Examiner

R. C. WOODBRIDGE, Assistant Examiner

U.S. Cl. X.R.

307—264, 302; 328—119; 329—134